(12) United States Patent
Kim et al.

(10) Patent No.: US 10,038,018 B2
(45) Date of Patent: Jul. 31, 2018

(54) IMAGE SENSOR HAVING PHASE DIFFERENCE SENSING PIXELS ARRANGED IN IRREGULAR HEXAGONAL SHAPE

(71) Applicants: SK hynix Inc., Gyeonggi-do (KR); Chung-Ang University Industry Academic Cooperation Foundation, Seoul (KR)

(72) Inventors: Jong-Heon Kim, Gyeonggi-do (KR); Jae-Hyun Im, Gyeonggi-do (KR); Jae-Hwan Jeon, Gyeonggi-do (KR); Wan-Hee Jo, Gyeonggi-do (KR); Joon-Ki Paik, Seoul (KR); Jin-Beum Jang, Seoul (KR); Yoon-Jong Yoo, Seoul (KR)

(73) Assignees: SK Hynix Inc., Gyeonggi-do (KR); Chung-Ang University Industry Academic Cooperation Foundation, Seoul (KR)

(*) Notice: Subject to any disclaimer, the term of this patent is extended or adjusted under 35 U.S.C. 154(b) by 20 days.

(21) Appl. No.: 15/251,897

(22) Filed: Aug. 30, 2016

(65) Prior Publication Data
US 2017/0309662 A1   Oct. 26, 2017

(30) Foreign Application Priority Data
Apr. 20, 2016   (KR) .......................... 10-2016-0048314

(51) Int. Cl.
G09G 5/02        (2006.01)
H01L 27/146      (2006.01)
H04N 5/378       (2011.01)

(52) U.S. Cl.
CPC .. *H01L 27/14605* (2013.01); *H01L 27/14645* (2013.01); *H04N 5/378* (2013.01)

(58) Field of Classification Search
None
See application file for complete search history.

(56) References Cited

U.S. PATENT DOCUMENTS

| | | | |
|---|---|---|---|
| 8,730,545 B2 | 5/2014 | Endo et al. | |
| 2006/0146067 A1* | 7/2006 | Schweng | H04N 9/045 345/591 |
| 2011/0012820 A1* | 1/2011 | Kim | G09G 3/3208 345/82 |
| 2011/0109775 A1* | 5/2011 | Amano | H04N 5/23212 348/241 |
| 2013/0335604 A1* | 12/2013 | Hirota | H01L 27/14621 348/273 |
| 2015/0156400 A1 | 6/2015 | Seo | |
| 2017/0323592 A1* | 11/2017 | Hughes | G09G 3/2088 |

* cited by examiner

*Primary Examiner* — Ali Naraghi
(74) *Attorney, Agent, or Firm* — IP & T Group LLP (57) ABSTRACT

Provided is an image sensor. The image sensor includes a pixel array including a plurality of pixel blocks. Each of the plurality of pixel blocks includes a plurality of pixels arranged in a matrix form. Each of the plurality of pixels includes a plurality of phase difference sensing pixels. Each of the plurality of phase difference sensing pixels may be periodically repeatedly arranged in the pixel array in a horizontal direction and a vertical direction.

11 Claims, 11 Drawing Sheets

IMAGE SENSOR HAVING PHASE DIFFERENCE SENSING PIXELS ARRANGED IN IRREGULAR HEXAGONAL SHAPE

CROSS-REFERENCE TO RELATED APPLICATIONS

The application claims priority to Korean Patent Application No. 10-2016-0048314, filed on Apr. 20, 2016, which is herein incorporated by reference in its entirety.

BACKGROUND

1. Field

Exemplary embodiments relate to image sensors having phase difference sensing pixels which are arranged in irregular hexagonal shapes.

2. Description of the Related Art

An image sensor is a device that converts an optical image into an electrical signal. Recently, in the computer and communication industries, there is high demand for an image sensor which has an improved degree of integration and an improved performance. Such an image sensor may be applied in various devices such as digital cameras, camcorders, PCSs (Personal Communication Systems), game machines, security cameras, medicine micro cameras, and robots. Particularly, auto-focusing has recently been spotlighted, which can be accomplished by sensing a phase difference of light.

SUMMARY

Exemplary embodiments of the inventive concepts provide image sensors having phase difference sensing pixels arranged in various irregular hexagonal shapes.

An image sensor in accordance with an embodiment of the inventive concepts may include a pixel array including a plurality of pixel blocks. Each of the plurality of pixel blocks may include a plurality of pixels arranged in a matrix form. Each of the plurality of pixels may include a plurality of phase difference sensing pixels. Each of the plurality of phase difference sensing pixels may be periodically repeatedly arranged in the pixel array in a horizontal direction and a vertical direction.

The plurality of pixel blocks may include a first pixel block and a second pixel block adjacent to each other. Each of the first pixel block and the second pixel black may include at least four of the plurality of phase difference sensing pixels.

The first pixel block may include at least one first phase difference sensing pixel which is disposed at an upper side or at a lower side of the first pixel block, at least one second phase difference sensing pixel which is disposed at a left side or at a right side of the first pixel block, and a third phase difference sensing pixel and a fourth phase difference sensing pixel which are disposed in a middle area of the first pixel block. The middle area may be defined as an entire area of the first pixel block except for the upper side, the lower side, the left side, and the right side.

The first phase difference sensing pixel and the second phase difference sensing pixel may be disposed in a same column and vertically aligned with each other.

The third phase difference sensing pixel and the fourth phase difference sensing pixel may be disposed in a same column and vertically aligned with each other.

The first to the fourth phase difference sensing pixels may be disposed in different rows from each other so that any two of the first to the fourth phase difference sensing pixels are not horizontally aligned with each other.

An image sensor in accordance with an embodiment of the inventive concepts may include a plurality of pixel block pairs. Each of the plurality of pixel block pairs may include a plurality of phase difference sensing pixels. The plurality of phase difference sensing pixels may be arranged at least two irregular hexagonal shapes different from each other.

The plurality of pixel block pairs may include a first pixel block and a second pixel block adjacent to each other. The first pixel block may include a plurality of first phase difference sensing pixels. The second pixel block may include a plurality of second phase difference sensing pixels.

The plurality of first phase difference sensing pixels may include a first right-upper phase difference sensing pixel disposed at a right-upper part, a first right-lower phase difference sensing pixel disposed at a right-lower part, a first left-lower phase difference sensing pixel disposed at a left-lower part, and a first left-upper phase difference sensing pixel disposed at a left-upper part. The second phase difference sensing pixels may include a second right-upper phase difference sensing pixel disposed at a right-upper part, a second right-lower phase difference sensing pixel disposed at a right-lower part, a second left-lower phase difference sensing pixel disposed at a left-lower part, and a second left-upper phase difference sensing pixel disposed at a left-upper part.

The first right-upper phase difference sensing pixel and the second right-upper phase difference sensing pixel may be disposed in a same row and are horizontally aligned with each other.

The first right-upper phase difference sensing pixel and the second right-upper phase difference sensing pixel may be disposed at an upper side of the first pixel block and at an upper side of the second pixel block, respectively.

The first right-lower phase difference sensing pixel and the second right-lower phase difference sensing pixel may be disposed in a same row and are horizontally aligned with each other.

The first left-lower phase difference sensing pixel and the first left-upper phase difference sensing pixel may be disposed in a same column and are vertically aligned with each other. The second left-lower phase difference sensing pixel and the second left-upper phase difference sensing pixel may be disposed in a same column and are vertically aligned.

A horizontal distance between the first right-upper phase difference sensing pixel and the first left-upper phase difference sensing pixel may be greater than a horizontal distance between the second right-upper phase difference sensing pixel and the second left-upper phase difference sensing pixel.

A vertical distance between the first right-upper phase difference sensing pixel and the first right-lower phase difference sensing pixel may be greater than a vertical distance between the second right-upper phase difference sensing pixel and the second right-lower phase difference sensing pixel.

An image sensor in accordance with one embodiment may include a pixel array having pixel blocks. The pixel blocks may be arranged in a matrix form. The pixel blocks may include phase difference sensing pixels. The phase difference sensing pixels may be arranged to form first hexagons and second hexagons. The first hexagons and the second hexagons may be alternately repeated in a horizontal direction to form a first horizontal arrangement.

The first horizontal arrangement may be present in an odd row. The phase difference sensing pixels may be arranged to form third hexagons and fourth hexagons. The third hexagons and the fourth hexagons may be periodically repeated in the horizontal direction to form a second horizontal arrangement in an even row.

The first to the fourth hexagons may have a zigzag arrangement in a vertical direction.

The first to the fourth hexagons may have irregular hexagonal shapes and are different from one another.

The first horizontal arrangement and the second horizontal arrangement may be repeated in a vertical direction.

Since image sensors in accordance with various embodiments have phase difference sensing pixels arranged in a hexagonal shape, it is possible to improve phase difference sensing efficiency as compared with the case in which phase difference sensing pixels have been arranged in a rectangular shape.

Since image sensors in accordance with various embodiments include phase difference sensing pixels arranged in an irregular shape, it is possible to considerably reduce a problem that the phase difference sensing pixels are recognized as failed pixels.

Since image sensors in accordance with various embodiments sense a phase difference by using many more phase difference sensing pixels without failed pixels, it is possible to accurately and quickly sense a phase difference of various positions from video information.

Since image sensors in accordance with various embodiments include phase difference sensing pixels arranged in a hexagonal shape, a turtle back shape, or a honeycomb shape, the degree of planar space utilization is high. Consequently, many more characteristic points of video information may be sensed from the video information, so that it is possible to more accurately sense a phase difference.

DETAILED DESCRIPTION

Various embodiments will be described below in more detail with reference to the accompanying drawings. The invention may, however, be embodied in different forms and should not be construed as limited to the embodiments set forth herein. Rather, these embodiments are provided so that this disclosure will be thorough and complete, and will fully convey the scope of the invention to those skilled in the art. Throughout the disclosure, like reference numerals refer to like parts throughout the various figures and embodiments of the invention.

Figure 1:
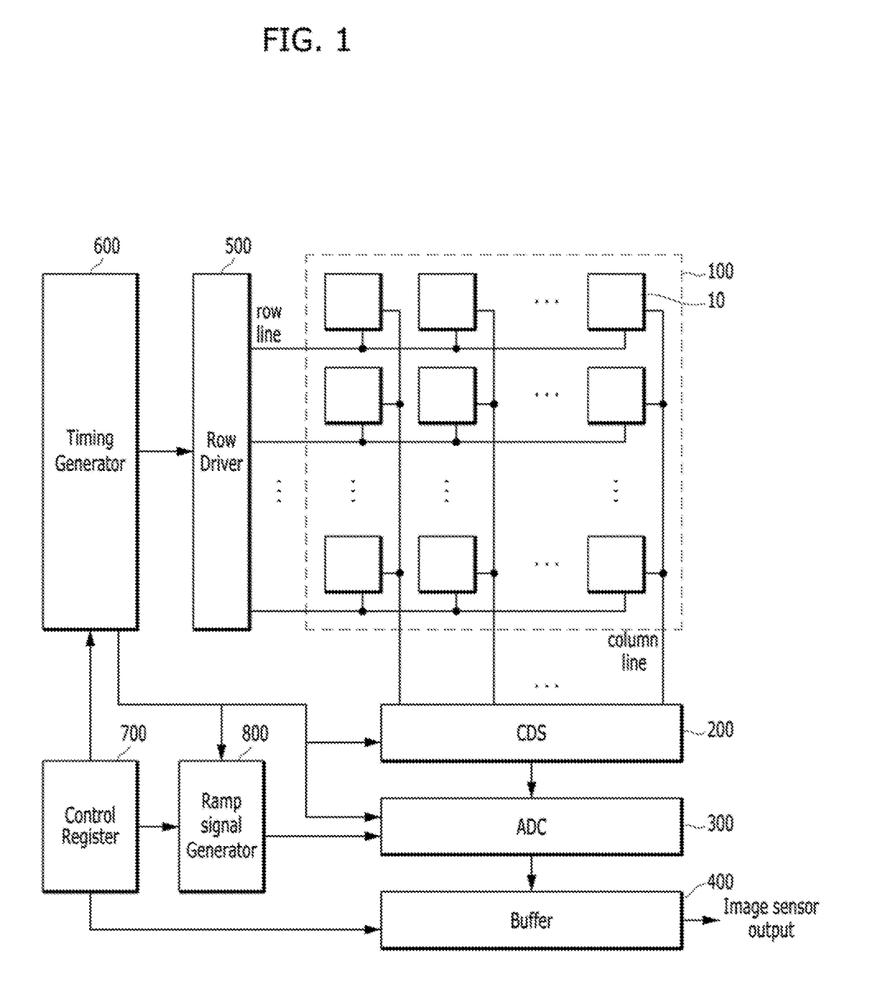
FIG. 1 is a conceptual block diagram schematically illustrating an image sensor in accordance with an embodiment of the inventive concepts.

FIG. 1 is a block diagram schematically illustrating an image sensor in accordance with an embodiment of the inventive concept. Referring to FIG. 1, the image sensor in accordance with an embodiment of the inventive concepts may include a pixel array 100, a correlated double sampler (CDS) 200, an analog-to-digital converter (ADC) 300, a buffer 400, a row driver 500, a timing generator 600, a control register 700, and a ramp signal generator 800.

The pixel array 100 may include a plurality of pixels 10 arranged in the matrix form. The plurality of pixels 10 may convert optical image information into an electrical image signal and transmit the electrical image signal to the CDS 200 through column lines. Each of the plurality of pixels 10 may be connected to one row line and one column line.

The CDS 200 may hold and sample the electrical image signals received from the pixels 10 of the pixel array 100. For example, the CDS 200 may sample a reference voltage level and voltage levels of the received electrical image signals according to a clock signal provided from the timing generator 600, and transmit an analog signal corresponding to the difference thereof to the ADC 300.

The ADC 300 may convert the received analog signal into a digital signal and transmit the digital signal to the buffer 400.

The buffer 400 may latch the received digital signal and output the latched signal to a video signal processor (not illustrated). The buffer 400 may include a memory to latch the digital signal and a sense amplifier to amplify the digital signal.

The row driver 500 may drive the plurality of pixels 10 of the pixel array 100 according to a signal from the timing generator 600. For example, the row driver 500 may generate driving signals to select and drive one of a plurality of row lines.

The timing generator 600 may generate a timing signal to control the CDS 200, the ADC 300, the row driver 500, and the ramp signal generator 800.

The control register 700 may generate control signals to control the buffer 400, the timing generator 600 and the ramp signal generator 800.

The ramp signal generator 800 may generate a ramp signal to control an image signal, which is outputted from the buffer 400, under the control of the timing generator 600.

Some of the plurality of pixels 10 may include phase difference sensing pixels (11a to 11d and 12a to 12d of FIG. 2A) in accordance with one embodiment, which will be described below.

Figure 2A:
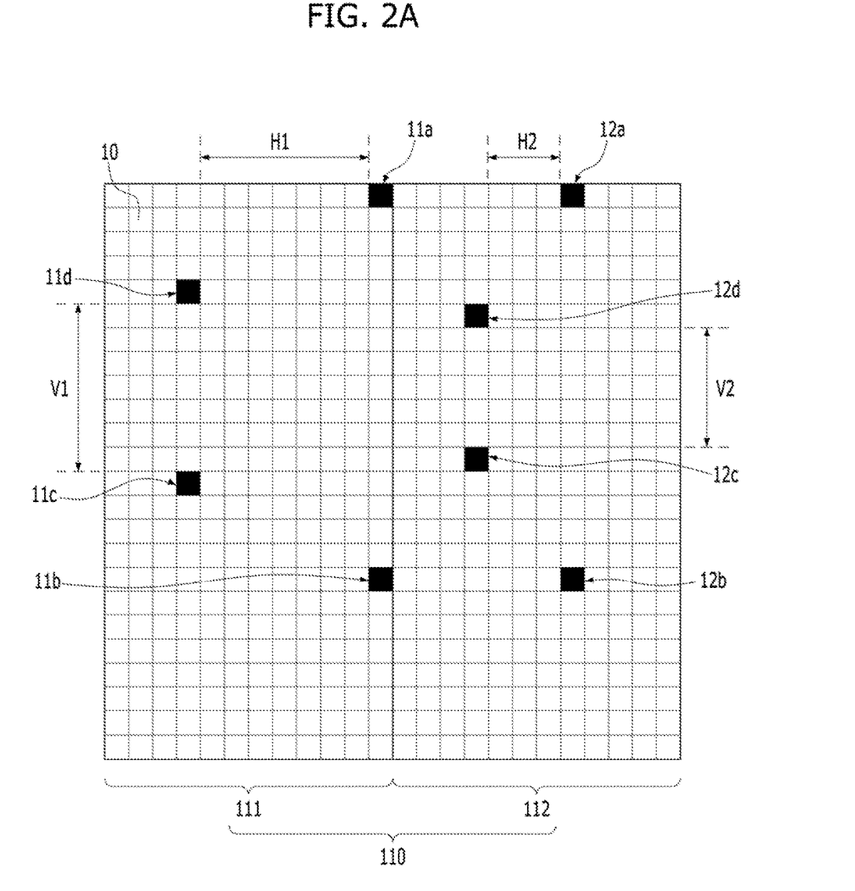
FIG. 2A, FIG. 3A, and FIG. 4A are conceptual layouts of pixel block pairs in accordance with various embodiments of the inventive concepts.
Figure 2B:
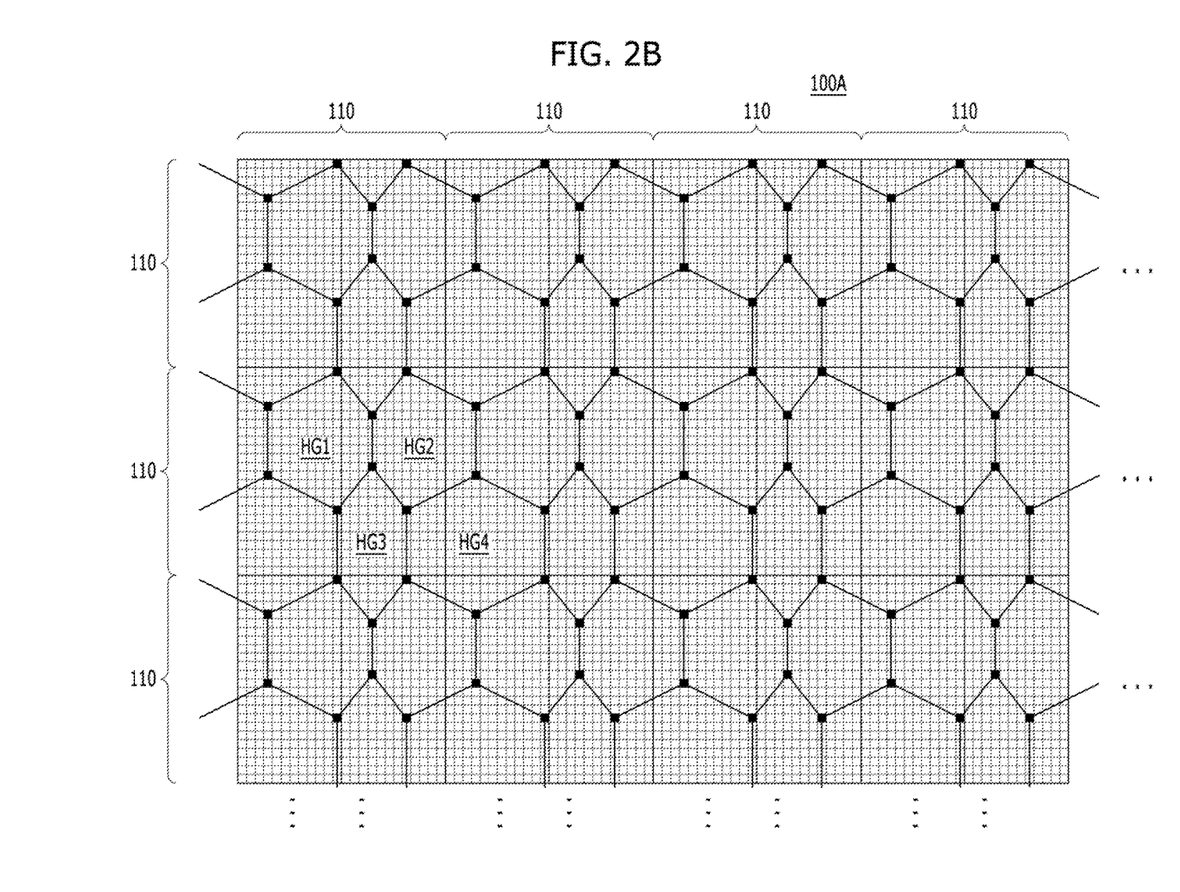
FIG. 2B, FIG. 3B, and FIG. 4B are conceptual layouts of pixel arrays in accordance with various embodiments of the inventive concepts.

FIG. 2A is a layout of a pixel block pair 110 in accordance with one embodiment and FIG. 2B is a layout of a pixel array 100A in accordance with an embodiment of the inventive concepts.

Referring to FIG. 2A, the pixel array 100A in accordance with an embodiment of the inventive concepts may include a plurality of pixel block pairs 110. Each pixel block pair 110 may include a first pixel block 111 and a second pixel block 112 arranged adjacent to each other. Each of the first pixel block 111 and the second pixel block 112 may include the plurality of pixels 10 arranged in a matrix form.

For example, each of the first pixel block 111 and the second pixel block 112 may include 12×12 pixels, 16×16 pixels, 24×24 pixels, 32×32 pixels, 48×24 pixels, 48×48 pixels, 64×32 pixels, 64×64 pixels, and so on. In an embodiment, the pixel block pair 110 has a size of 24 (rows) 12 (columns).

Each of the first pixel block 111 and the second pixel block 112 may include a plurality of phase difference sensing pixels 11a to 11d and 12a to 12d. In an embodiment, the first pixel block 111 includes the four phase difference sensing pixels 11a to 11d and the second pixel block 112 includes the four phase difference sensing pixels 12a to 12d. Specifically, the first pixel block 111 may include the first right-upper phase difference sensing pixel 11a disposed at a right-upper part, the first right-lower phase difference sensing pixel 11b disposed at a right-lower part, the first left-lower phase difference sensing pixel 11c disposed at a left-lower part, and the first left-upper phase difference sensing pixel 11d disposed at a left-upper part. The second pixel block 112 may include the second right-upper phase difference sensing pixel 12a disposed at a right-upper part, the second right-lower phase difference sensing pixel 12b disposed at a right-lower part, the second left-lower phase difference sensing pixel 12c disposed at a left-lower part, and the second left-upper phase difference sensing pixel 12d disposed at a left-upper part.

At least one of the first phase difference sensing pixels 11a to 11d of the first pixel block 111 may be disposed at an upper side or a lower side of the first pixel block 111. In the drawing, the first right-upper phase difference sensing pixel 11a is disposed at the upper side of the first pixel block 111. At least one of the first phase difference sensing pixels 11a to 11d of the first pixel block 111 may be disposed at a left side or a right side of the first pixel block 111. In addition, since the number of rows of the first pixel block 111 is greater than the number of columns of the first pixel block 111, for example, twice greater, two or more of the first phase difference sensing pixels 11a to 11d of the first pixel block 111 may be disposed at the left side or at the right side of the first pixel block 111. In the drawing, the first right-upper phase difference sensing pixel 11a and the first right-lower phase difference sensing pixel 11b may be disposed at the right side of the first pixel block 111.

At least two of the first phase difference sensing pixels 11a to 11d of the first pixel block 111 may be disposed at any of four sides of the first pixel block 111. In the drawing, the first left-lower phase difference sensing pixel 11c and the first left-upper phase difference sensing pixel 11d are disposed in a middle area of the first pixel block 111, rather than at any side of the first pixel block 111. The middle area is defined as an entire area of the first pixel block except for the upper side, the lower side, the left side, and the right side.

At least one of the second phase difference sensing pixels 12a to 12d of the second pixel block 112 may be disposed at an upper side or at a lower side of the second pixel block 112. In the embodiment, the second right-upper phase difference sensing pixel 12a is disposed at the upper side of the second pixel block 112.

At least two of the second phase difference sensing pixels 12a to 12d of the second pixel block 112 may be disposed in the middle area of the second pixel block 112 and not be exposed to any side of the second pixel block 112. In the embodiment, the second right-lower phase difference sensing pixel 12b, the second left-lower phase difference sensing pixel 12c, and the second left-upper phase difference sensing pixel 12d may be disposed in the middle area of the second pixel block 112. The "middle area" can be interpreted as "an area not to abut on or contact the sides of the pixel blocks 111 and 112".

The first right-upper phase difference sensing pixel 11a and the first right-lower phase difference sensing pixel 11b may be disposed in the same column and aligned vertically to each other. The first left-lower phase difference sensing pixel 11c and the first left-upper phase difference sensing pixel 11d may also be disposed in the same column and aligned vertically to each other. All of the first phase difference sensing pixels 11a to 11d may be disposed in different rows from each other and may not be horizontally aligned.

The second right-upper phase difference sensing pixel 12a and the second right-lower phase difference sensing pixel 12b may be disposed in the same column and aligned vertically to each other. The second left-lower phase difference sensing pixel 12c and the second left-upper phase difference sensing pixel 12d may also be disposed in the same column and aligned vertically to each other. All of the second phase difference sensing pixels 12a to 12d may be disposed in different rows from each other and may not be horizontally aligned.

The first right-upper phase difference sensing pixel 11a and the second right-upper phase difference sensing pixel 12a may be disposed at the same row and aligned horizontally with each other. The first right-lower phase difference sensing pixel 11b and the second right-lower phase difference sensing pixel 12b may be disposed at the same row and aligned horizontally with each other.

The first left-lower phase difference sensing pixel 11c and the second left-lower phase difference sensing pixel 12c may be disposed at different rows from each other and may not be horizontally aligned with each other. The first left-upper phase difference sensing pixel 11d and the second left-upper phase difference sensing pixel 12d may be disposed at different rows from each other and may not be horizontally aligned with each other.

A horizontal distance H1 between the first right-upper phase difference sensing pixel 11a and the first left-upper phase difference sensing pixel 11d in the first pixel block 111 may be greater than a horizontal distance H2 between the second right-upper phase difference sensing pixel 12a and the second left-upper phase difference sensing pixel 12d in the second pixel block 112. Accordingly, a horizontal distance H1 between the first right-lower phase difference sensing pixel 11b and the first left-lower phase difference sensing pixel 11c in the first pixel block 111 may be greater than a horizontal distance H2 between the second right-lower phase difference sensing pixel 12b and the second left-lower phase difference sensing pixel 12c in the second pixel block 112. That is, H1>H2.

A vertical distance V1 between the first left-lower phase difference sensing pixel 11c and the first left-upper phase difference sensing pixel 11d in the first pixel block 111 may be greater than a vertical distance V2 between the second left-lower phase difference sensing pixel 12c and the second left-upper phase difference sensing pixel 12d in the second pixel block 112. That is, V1>V2.

A vertical distance between the first right-upper phase difference sensing pixel 11a and the first right-lower phase difference sensing pixel 11b may be substantially the same as that between the second right-upper phase difference sensing pixel 12a and the second right-lower phase difference sensing pixel 12b.

Referring to FIG. 2B, the pixel array 100A in accordance with an embodiment of the inventive concepts may include the plurality of pixel block pairs 110 arranged in a matrix form. For example, the pixel block pairs 110 illustrated in FIG. 2A may be arranged in a matrix form to form the pixel array 100A. The phase difference sensing pixels 11a to 11d and 12a to 12d may be arranged in hexagonal shapes HG1 to HG4. Specifically, when lines are connected from a given phase difference sensing pixel to three of the phase difference sensing pixels 11a to 11d and 12a to 12d, which are located nearest to the given phase difference sensing pixel and surround the given phase difference sensing pixel, the phase difference sensing pixels 11a to 11d and 12a to 12d form an arrangement of irregular hexagonal shapes HG1 to HG4.

Geometrically, the phase difference sensing pixels 11a to 11d and 12a to 12d may have an arrangement of an irregular turtle-back shape or an irregular honeycomb shape. That is, such an arrangement of the phase difference sensing pixels 11a to 11d and 12a to 12d may be periodically repeated in a horizontal direction and in a vertical direction in units of pixel block pairs 110 throughout the pixel array 100A. In other words, four types of irregular hexagons HG1 to HG4 may be repetitively arranged in a zigzag shape in the row direction. Alternatively, symmetrical or mirrored irregular hexagons HG1 to HG4 may be repeated in the horizontal direction. Two types of mirrored irregular hexagons HG1 and HG2 may be repeated on upper halves of the first pixel block 111 and the second pixel block 112 in the horizontal direction, and two types of mirrored irregular hexagons HG3 and HG4 may be repeated on lower halves of the first pixel block 111 and the second pixel block 112 in the horizontal direction.

Specifically, lines may be connected from given phase difference sensing pixels 11a to 11d and 12a to 12d to adjacent three of the phase difference sensing pixels 11a to 11d and 12a to 12d, resulting in the phase difference sensing pixels 11a to 11d and 12a to 12d forming a first horizontal arrangement in which the first hexagon HG1 and the second hexagon HG2 are periodically repeated in odd rows in the horizontal direction. A second horizontal arrangement is also formed in which the third hexagon HG3 and the fourth hexagon HG4 are periodically repeated in even rows in the horizontal direction.

The first to fourth hexagons HG1 to HG4 may have shapes different from one another. The first to fourth hexagons HG1 to HG4 may be arranged in a zigzag shape in the vertical direction. Specifically, the first hexagon HG1 and the third hexagon HG3 may be arranged in a zigzag shape in the vertical direction, or the first hexagon HG1 and the fourth hexagon HG4 may be arranged in a zigzag shape in the vertical direction. The second hexagon HG2 and the third hexagon HG3 may be arranged in a zigzag shape in the vertical direction, or the second hexagon HG2 and the fourth hexagon HG4 may be arranged in a zigzag shape in the vertical direction.

Figure 3A:
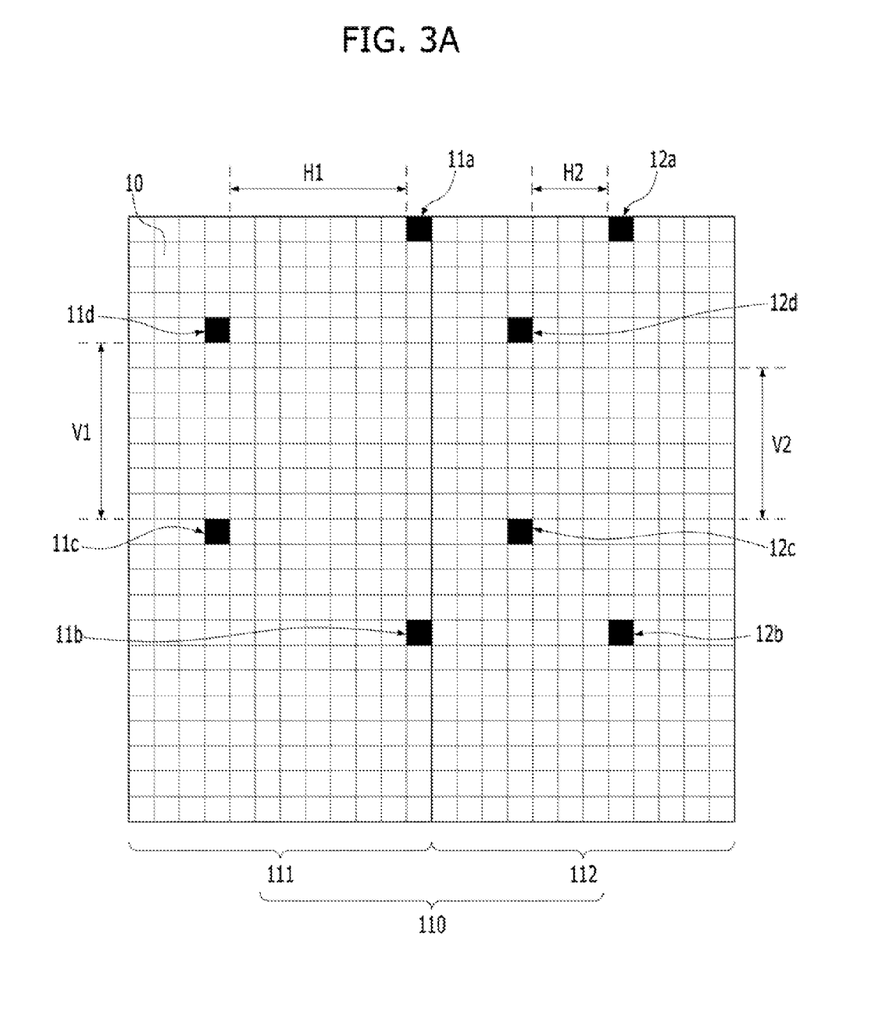
Figure 3B:
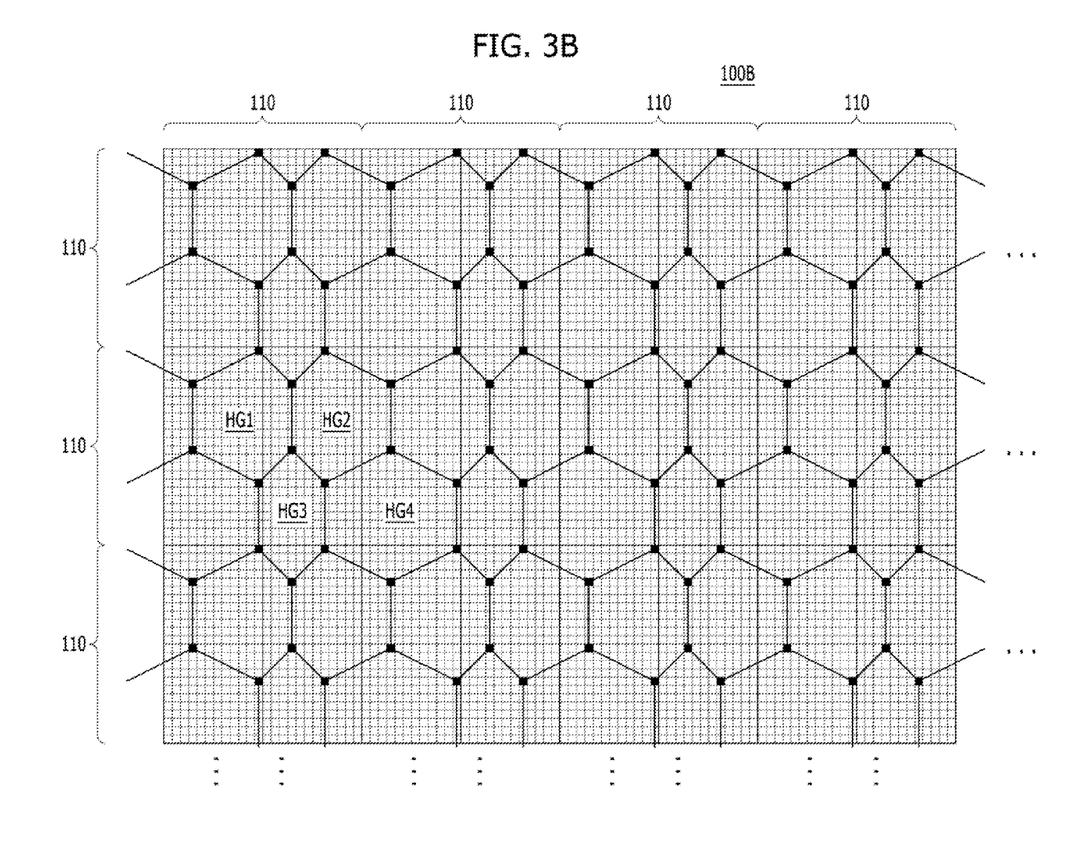

FIG. 3A is a layout of a pixel block pair 110 in accordance with one embodiment and FIG. 3B is a layout of a pixel array 100B in accordance with another embodiment of the inventive concepts.

Referring to FIG. 3A, in the pixel block pair 110 in accordance with an embodiment of the inventive concepts, the first left-lower phase difference sensing pixel 11c and the second left-lower phase difference sensing pixel 12c may be disposed at the same row, and/or the first left-upper phase difference sensing pixel 11d and the second left-upper phase difference sensing pixel 12d may be disposed at the same row, as compared with the pixel block pair 110 illustrated in FIG. 2A. Under this structure, a vertical distance V1 between the first left-lower phase difference sensing pixel 11c and the first left-upper phase difference sensing pixel 11d in the first pixel block 111 may be substantially equal to a vertical distance V2 between the second left-lower phase difference sensing pixel 12c and the second left-upper phase difference sensing pixel 12d in the second pixel block 112. That is, V1=V2.

Referring to FIG. 3B, similarly to FIG. 2B, the pixel array 100B in accordance with an embodiment of the inventive concepts may include a plurality of pixel block pairs 110 arranged in a matrix form. For example, the pixel block pairs 110 illustrated in FIG. 3A may be arranged in a matrix form. Similarly, the irregular arrangement of such phase difference sensing pixels 11a to 11d and 12a to 12d may be repeated in units of the pixel block pairs 110 throughout the pixel array 100B.

The technical scope of the embodiment of the inventive concepts described with reference to the pixel array 100A illustrated in FIG. 2B may also be applied to the pixel array 100B illustrated in FIG. 3B.

Figure 4A:
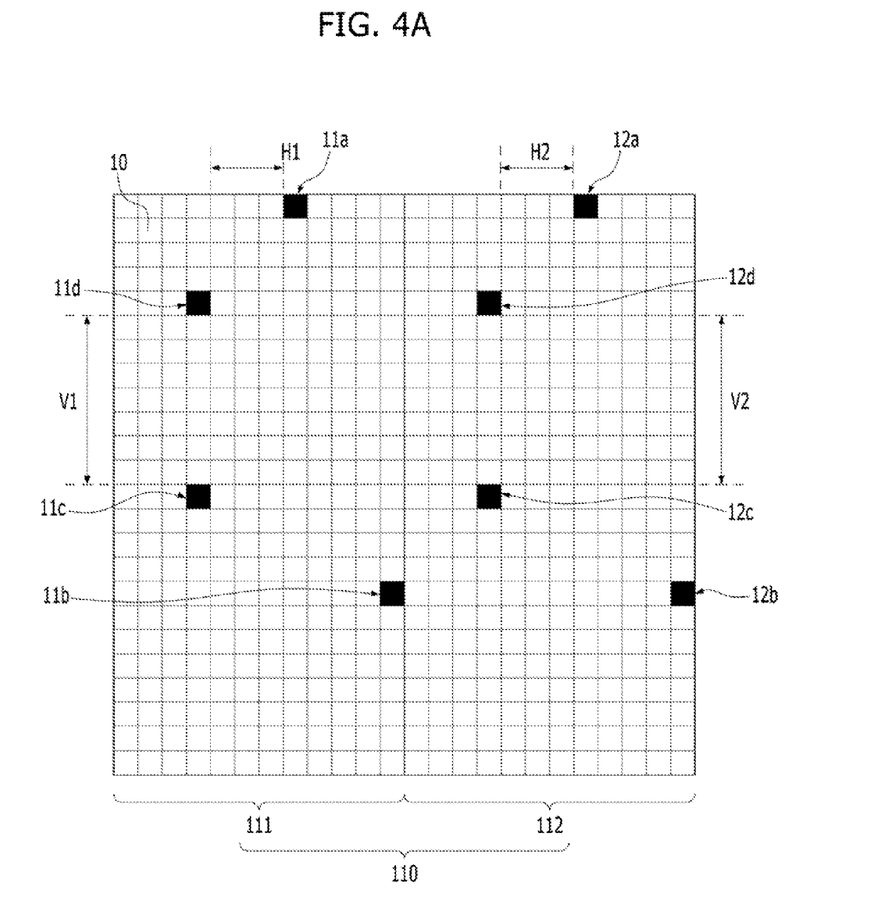
Figure 4B:
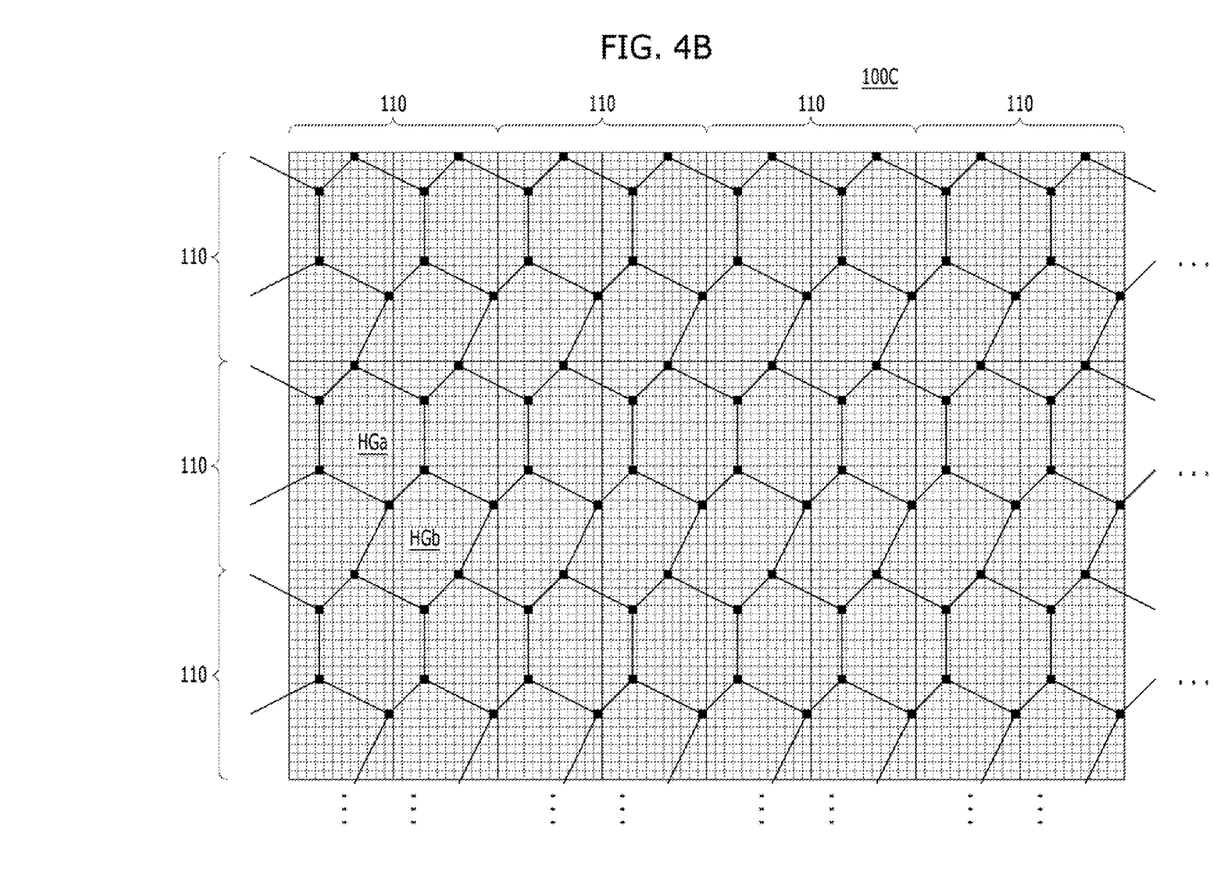

FIG. 4A is a layout of a pixel block pair 110 in accordance with one embodiment and FIG. 4B is a layout of a pixel array 100C in accordance with another embodiment of the inventive concepts.

Referring to FIG. 4A, in the pixel block pair 110 in accordance with an embodiment of the inventive concepts, relative positions of the first phase difference sensing pixels 11a to 11d in the first pixel block 111 may be substantially equal to relative positions of the second phase difference sensing pixels 12a to 12d in the second pixel block 112, as compared with the pixel block pair 110 illustrated in FIG. 2A or FIG. 3A. Specifically, the first right-upper phase difference sensing pixel 11a and the second right-upper phase difference sensing pixel 12a may be disposed at the same coordinates in the first pixel block 111 and the second pixel block 112 respectively.

In the drawing, the first right-upper phase difference sensing pixel 11a and the second right-upper phase difference sensing pixel 12a are disposed on intersections of the first rows and the eighth columns in the first pixel block 111 and the second pixel block 112, respectively. Similarly, the first right-lower phase difference sensing pixel 11b and the second right-lower phase difference sensing pixel 12b are disposed on relatively the same coordinates in the first pixel block 111 and the second pixel block 112, respectively. The first left-lower phase difference sensing pixel 11c and the second left-lower phase difference sensing pixel 12c are disposed on relatively the same coordinates in the first pixel block 111 and the second pixel block 112, respectively. The first left-upper phase difference sensing pixel 11d and the second left-upper phase difference sensing pixel 12d are disposed on relatively the same coordinates in the first pixel block 111 and the second pixel block 112, respectively.

In the drawing, the first right-lower phase difference sensing pixel 11b and the second right-lower phase difference sensing pixel 12b are respectively disposed on intersections of the seventh rows and the twelfth columns in the first pixel block 111 and the second pixel block 112. The first left-lower phase difference sensing pixel 11c and the second left-lower phase difference sensing pixel 12c are respectively disposed on intersections of the thirteenth rows and the fourth columns in the first pixel block 111 and the second pixel block 112. The first left-upper phase difference sensing pixel 11d and the second left-upper phase difference sensing pixel 12d are respectively disposed on intersections of the fifth rows and the fourth columns in the first pixel block 111 and the second pixel block 112.

In addition, the first right-upper phase difference sensing pixel 11a may not be located at the left side or the right side of the first pixel block 111. The second right-lower phase difference sensing pixel 12b may be located at the left side or at the right side of the second pixel block 112.

A horizontal distance H1 between the first right-upper phase difference sensing pixel 11a and the first left-upper phase difference sensing pixel 11d in the first pixel block 111 may be substantially equal to a horizontal distance H2 between the second right-upper phase difference sensing pixel 12a and the second left-upper phase difference sensing pixel 12d in the second pixel block 112.

The first right-upper phase difference sensing pixel 11a and the first right-lower phase difference sensing pixel 11b may be disposed in different columns and may not be aligned vertically to each other. The second right-upper phase difference sensing pixel 12a and the second right-lower phase difference sensing pixel 12b may also be disposed in different columns and may not be aligned vertically to each other.

Referring to FIG. 4B, the pixel array 100C in accordance with an embodiment of the inventive concepts may include a plurality of pixel block pairs 110 arranged in a matrix form, similarly to FIG. 2B and FIG. 3B. Specifically, the phase difference sensing pixels 11a to 11d and 12a to 12d may be arranged such that two types of irregular hexagons HGa and HGb are arranged in a zigzag shape in the row direction. That is, the irregular hexagons HGa and HGb may be horizontally repeated in the pixel block pairs 110 throughout the pixel array 100C. The irregular hexagons HGa may be horizontally repeated to occupy an upper half of the first pixel block 111 and an upper half of the second pixel block 112. The irregular hexagons HGb may be horizontally repeated to occupy a lower half of the first pixel block 111 and a lower half of the second pixel block 112.

Figure 5A:
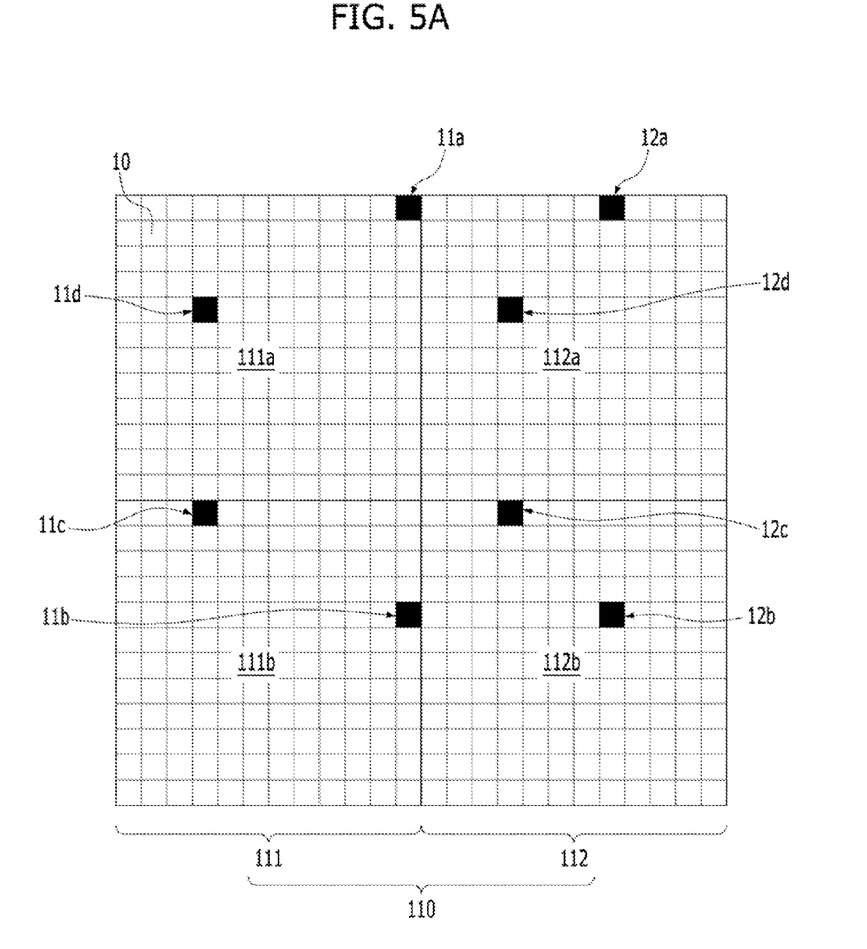
FIG. 5A and FIG. 5B are layouts of pixel block pairs in accordance with various embodiments of the inventive concepts.
Figure 5B:
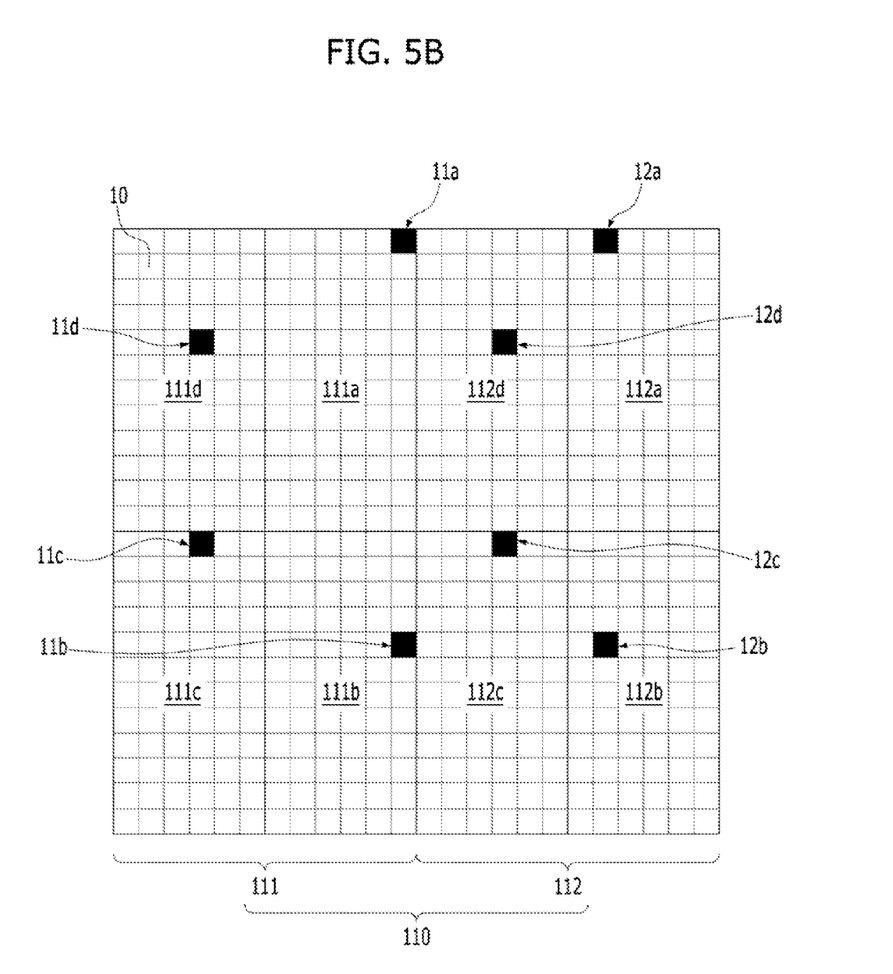

FIG. 5A and FIG. 5B are layouts of pixel block pairs 100 in accordance with various embodiments of the inventive concepts. Referring to FIG. 5A, as compared with FIG. 2A, FIG. 3A, and FIG. 4A, the first pixel block 111 and the second pixel block 112 of the pixel block pairs 100 may include two sub-pixel blocks 111a/111b and 112a/112b, respectively. The first pixel block 111 and the second pixel block 112 of FIG. 2A, FIG. 3A, and FIG. 4A have been described to have 24 rows and 12 columns. However, in FIG. 5A, the first pixel block 111 may have the first sub-pixel block 111a and the first sub-pixel block 111b each having 12 rows and 12 columns. The second pixel block 112 may have the first sub-pixel block 112a and the second sub-pixel block 112b each having 12 rows and 12 columns. In an embodiment, the sub-pixel blocks 111a, 111b, 112a, and 112b may have two phase difference sensing pixels 11a and 11d, 11c and 11b, 12a and 12d, and 12c and 12b, respectively. The arrangement of the phase difference sensing pixels 11a to 11d and 12a to 12d may be the same as shown in FIG. 2A, FIG. 3A, or FIG. 4A.

Referring to FIG. 5B, as compared with FIG. 2A, FIG. 3A, FIG. 4A, and FIG. 5A, the first pixel block 111 and the second pixel block 112 of the pixel block pairs 100 may be divided into four sub-pixel blocks 111a to 111d and 112a to 112d, respectively. In an embodiment, the sub-pixel blocks 111a to 111d and 112a to 112d may have phase difference sensing pixels 11a to 11d and 12a to 12d, respectively. Similarly to FIG. 5A, the arrangement of the phase difference sensing pixels 11a to 11d and 12a to 12d may be the same as shown in FIG. 2A, FIG. 3A, or FIG. 4A.

Figure 6A:
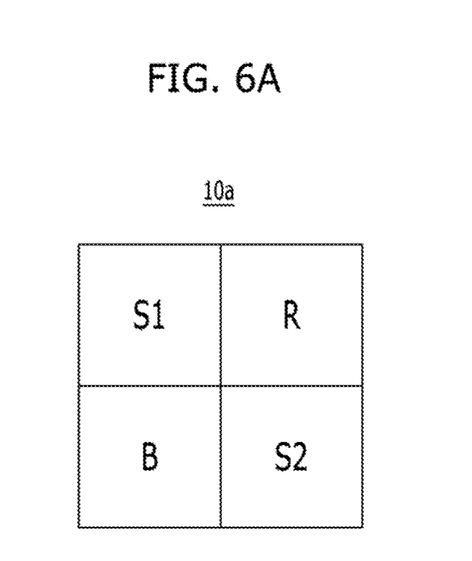
FIG. 6A and FIG. 6B are layouts of phase difference sensing pixels in accordance with various embodiments of the inventive concepts.
Figure 6B:
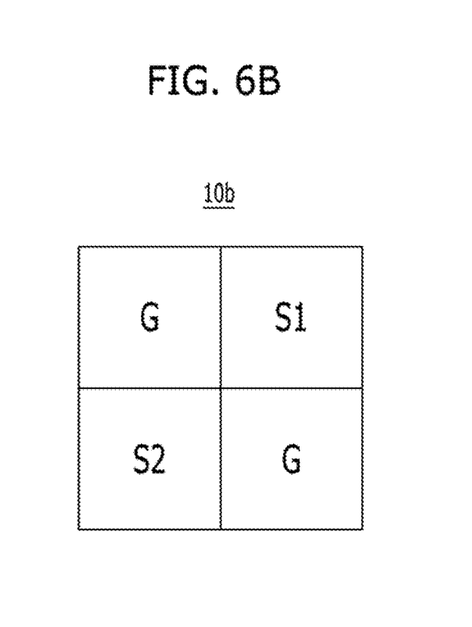

FIG. 6A and FIG. 6B are layouts of phase difference sensing pixels 10a and 10b in accordance with various embodiments of the inventive concepts. Referring to FIG. 6A, the phase difference sensing pixel 10a in accordance with an embodiment of the inventive concepts may include unit pixels R, B, S1, and S2 with a structure of 2×2 and may have two or more unit phase difference sensing pixels S1 and S2. Specifically, the phase difference sensing pixel 10a may have the red pixel R, the blue pixel B, and the first and second unit phase difference sensing pixels S1 and S2.

Referring to FIG. 6B, the phase difference sensing pixel 10b in accordance with an embodiment of the inventive concepts may have two green pixels G and the first and second unit phase difference sensing pixels S1 and S2. Referring to FIG. 6A and FIG. 6B, the first and second unit phase difference sensing pixels S1 and S2 may be diagonally disposed.

Figure 7:
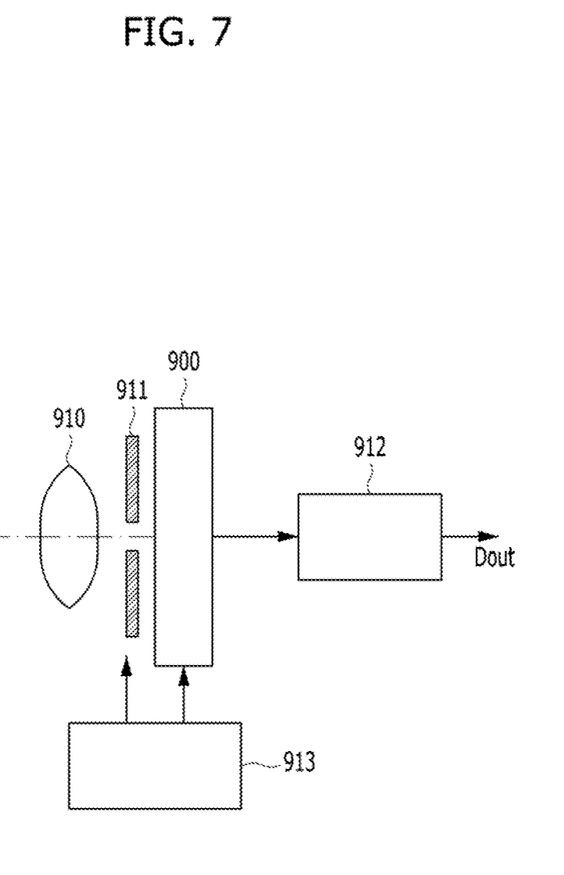
FIG. 7 is a diagram schematically illustrating an electronic device including one or more of image sensors having a pixel array in accordance with various embodiments of the inventive concepts.

FIG. 7 is a diagram schematically illustrating an electronic device including at least one image sensor having one or more of the pixel arrays 100A to 100C in accordance with various embodiments.

Referring to FIG. 7, the electronic device including at least one image sensor having one or more of the pixel arrays 100A to 100C in accordance with various embodiments of the inventive concepts may include a camera capable of capturing a still image or a moving image. The electronic device may include an optical system or an optical lens 910, a shutter unit 911, a driving unit 913 that controls and drives an image sensor 900 and the shutter unit 911, and a signal processing unit 912.

The optical system 910 guides image light that is, incident light from an object to the pixel array 100 of FIG. 1 of the image sensor 900. The optical system 910 may include a plurality of optical lenses. The shutter unit 911 controls a light irradiation period and a shielding period for the image sensor 900. The driving unit 913 controls a transmission operation of the image sensor 900 and a shutter operation of the shutter unit 911. The signal processing unit 912 performs various types of signal processing with respect to signals outputted from the image sensor 900. An image signal bout generated by the signal processing is stored in a storage medium such as a memory or is outputted to monitor and the like.

Although various embodiments have been described for illustrative purposes, it will be apparent to those skilled in the art that various changes and modifications may be made without departing from the spirit and scope of the invention as defined in the following claims.

What is claimed is:

1. An image sensor comprising:
    a pixel array including a plurality of pixel blocks,
    wherein each of the plurality of pixel blocks comprises a plurality of pixels arranged in a matrix form,
    wherein the plurality of pixels comprises a plurality of phase difference sensing pixels, and
    wherein the plurality of phase difference sensing pixels comprise at least two irregular hexagonal arrangements,
    wherein the irregular hexagonal arrangements are repeatedly arranged in the pixel array in a horizontal direction and a vertical direction.

2. The image sensor of claim 1, wherein the plurality of pixel blocks comprise a first pixel block and a second pixel block adjacent to each other, and
    wherein the first pixel block and the second pixel block includes at least four of the plurality of phase difference sensing pixels.

3. The image sensor of claim 2, wherein the first pixel block comprises:
    at least one first phase difference sensing pixel which is disposed at an upper side or at a lower side of the first pixel block;

at least one second phase difference sensing pixel which is disposed at a left side or at a right side of the first pixel block; and a third phase difference sensing pixel and a fourth phase difference sensing pixel which are disposed in a middle area of the first pixel block, wherein the middle area is defined as an entire area of the first pixel block except for the upper side, the lower side, the left side, and the right side.

4. The image sensor of claim 3, wherein the first phase difference sensing pixel and the second phase difference sensing pixel are disposed in a same column and vertically aligned with each other.

5. The image sensor of claim 3, wherein the third phase difference sensing pixel and the fourth phase difference sensing pixel are disposed in a same column and vertically aligned with each other.

6. The image sensor of claim 3, wherein the first to the fourth phase difference sensing pixels are disposed in different rows from each other so that any two of the first to the fourth phase difference sensing pixels are not horizontally aligned with each other.

7. An image sensor comprising:
a pixel array having pixel blocks,
wherein the pixel blocks are arranged in a matrix form,
wherein the pixel blocks include phase difference sensing pixels,
wherein the phase difference sensing pixels are arranged to form first hexagons and second hexagons, and
wherein the first hexagons and the second hexagons are alternately repeated in a horizontal direction to form a first horizontal arrangement.

8. The image sensor of claim 7, wherein the first horizontal arrangement is present in an odd row,
wherein the phase difference sensing pixels are arranged to form third hexagons and fourth hexagons, and
wherein the third hexagons and the fourth hexagons are periodically repeated in the horizontal direction to form a second horizontal arrangement in an even row.

9. The image sensor of claim 8, wherein the first to the fourth hexagons have a zigzag arrangement in a vertical direction.

10. The image sensor of claim 8, wherein the first to the fourth hexagons have irregular hexagonal shapes and are different from one another.

11. The image sensor of claim 8, wherein the first horizontal arrangement and the second horizontal arrangement are repeated in a vertical direction.

* * * * *